United States Patent
Woods et al.

(10) Patent No.: US 8,141,013 B2
(45) Date of Patent: Mar. 20, 2012

(54) METHOD AND SYSTEM OF LINKING ON-CHIP PARASITIC COUPLING CAPACITANCE INTO DISTRIBUTED PRE-LAYOUT PASSIVE MODELS

(75) Inventors: Wayne H. Woods, Essex Junction, VT (US); Cole E. Zemke, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 12/494,723

(22) Filed: Jun. 30, 2009

(65) Prior Publication Data
US 2010/0333051 A1   Dec. 30, 2010

(51) Int. Cl.
*G06F 17/50* (2006.01)
(52) U.S. Cl. ........... 716/106; 716/111; 716/136; 703/16
(58) Field of Classification Search .................. 716/106, 716/111, 136; 703/16
See application file for complete search history.

(56) References Cited

U.S. PATENT DOCUMENTS

| | | | |
|---|---|---|---|
| 6,487,700 B1 * | 11/2002 | Fukushima | 716/106 |
| 6,560,757 B1 * | 5/2003 | Ballam | 716/106 |
| 6,701,492 B2 * | 3/2004 | Jaklic et al. | 716/115 |
| 6,912,494 B1 * | 6/2005 | Ballam | 703/4 |
| 6,948,145 B2 * | 9/2005 | Brown et al. | 716/119 |
| 6,959,271 B1 * | 10/2005 | Ballam | 703/14 |
| 7,103,488 B2 | 9/2006 | Goren et al. | |
| 7,350,132 B2 * | 3/2008 | Kuekes et al. | 714/758 |
| 2006/0259883 A1 | 11/2006 | Cohen et al. | |
| 2007/0094622 A1 | 4/2007 | Lee | |
| 2011/0126162 A1 * | 5/2011 | Boerstler et al. | 716/100 |

OTHER PUBLICATIONS

Golonka et al., "Embedded Passive Components for MCM", IEEE 24th International Spring Seminar on Electronics Technology, May 5-9, 2001, pp. 73-77.*

Windschiegl, et al. "A Wire Load Model for More Accurate Power Estimation", IEEE 0-7803-7523-8/02, pp. 1-376-1-379, 2002.

* cited by examiner

*Primary Examiner* — Phallaka Kik
(74) *Attorney, Agent, or Firm* — Gibb I.P. Law Firm, LLC (57) ABSTRACT

A method of linking on-chip parasitic coupling capacitance into distributed pre-layout passive models such as distributed transmission line models and on-chip spiral inductor models includes recognizing a passive device such as a distributed transmission line device and an on-chip spiral inductor device, interpreting data obtained from the recognizing the passive device, breaking the passive device into a plurality of sections, the plurality of sections including a terminal of a model call, extracting parameters of the passive device by Layout Versus Schematic (LVS) and parasitic extraction, connecting the terminal to a pre-layout passive network by selectively low and high resistive paths set by the parameters of the passive device depending on whether crossing lines are present or not present in one of the plurality of sections, connecting the terminal to a distributed passive model, and coupling the crossing lines to the terminal via capacitors produced in an extracted netlist with the passive device having distributed coupling to a plurality of crossing lines.

19 Claims, 4 Drawing Sheets

METHOD AND SYSTEM OF LINKING ON-CHIP PARASITIC COUPLING CAPACITANCE INTO DISTRIBUTED PRE-LAYOUT PASSIVE MODELS

BACKGROUND OF THE INVENTION

The present invention relates generally to a method and system of linking on-chip parasitic coupling capacitance into distributed pre-layout passive models. In particular, the present invention relates to a method and system of linking on-chip parasitic coupling capacitance into distributed pre-layout passive models such as transmission lines and on-chip spiral inductors that accurately does so in a physically realistic manner.

On-chip passive models such as transmission lines (t-lines) are used for fast and accurate pre-layout estimation of high-frequency, critical interconnect configurations. A P-Cell draws the t-line layout and, through marker shapes, the Layout Versus Schematic (LVS) recognizes the t-line and calls the t-line "compact model". The LVS blocks parasitic extraction from extracting the capacitance, resistance, and inductance of the t-line metals.

In the case of t-lines, conventionally, the parasitic networks of neighboring conductors are accounted for by t-line model input parameters. In the case of coplanar waveguides (CPWs), for example, the variable "plane" is used to account for the parasitic networks due to neighboring lines. Several CPW models can be hooked in series in order to adjust frequency and bandwidth to design specifications.

However, conventionally in transmission line models, all crossing metal, no matter how sparse, is treated as a full plane. This causes inaccuracies because of an overestimation of the capacitance. Thus, conventionally, there is no way to model on-chip layout parasitic capacitance interactions with distributed pre-layout t-line models. Nevertheless, parasitic coupling capacitance to a pre-layout t-line must be modeled in a distributed manner to correctly predict delay. This is important in any critical on-chip interconnect path, especially with respect to clock lines. In the case of on-chip spiral inductors, conventionally, either all crossing metal is modeled as either full planes or ignored completely. As in the case of transmission lines, this causes inaccuracies in high-performance on-chip distributed spiral inductor models.

SUMMARY OF THE INVENTION

In view of the foregoing and other exemplary problems, drawbacks, and disadvantages of the conventional methods and structures, an exemplary object of the present invention is to provide a method of accurately linking and netlisting extracted parasitic data with a distributed passive model in a physically realistic manner.

An exemplary embodiment of the present invention includes a method of linking on-chip parasitic coupling capacitance into distributed pre-layout passive models, the method including recognizing a passive device, interpreting data obtained from the recognizing the passive device, breaking the passive device into a plurality of sections, the plurality of sections including a terminal of a model call, extracting parameters of the passive device by Layout Versus Schematic (LVS) and parasitic extraction, connecting the terminal to a pre-layout passive model network by a high resistive path through the parameters of the passive device when a crossing line is present over or under one of the plurality of sections, connecting the terminal to a passive model network by a low resistive path through the parameters of the passive device when a crossing line is present over or under one of the plurality of sections, and coupling the crossing line to the terminal via a capacitor produced in an extracted netlist with the passive device having distributed coupling to a plurality of crossing lines.

The distributed pre-layout passive models include a plurality of terminals to which post-layout extracted parasitics are attached to correctly model effects of a varying density of the plurality of crossing lines along a length of the transmission line device or within particular regions of an on-chip spiral inductor.

According to the exemplary embodiment detailed above, a method for modeling on-chip parasitic coupling capacitance in a distributed passive model allows pre-layout passive models to accurately include post-layout parasitics. Accuracy of transmission line modeling may be greatly improved using this method. The method may allow delay in critical interconnect paths, like clock lines to be accurately predicted with pre-layout models. Subsequently, s-parameter results are greatly improved, which is important for analog circuit applications.

BRIEF DESCRIPTION OF THE DRAWINGS

The foregoing and other exemplary purposes, aspects and advantages will be better understood from the following detailed description of an exemplary embodiment of the invention with reference to the drawings, in which.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION OF THE INVENTION

Figure 1A:
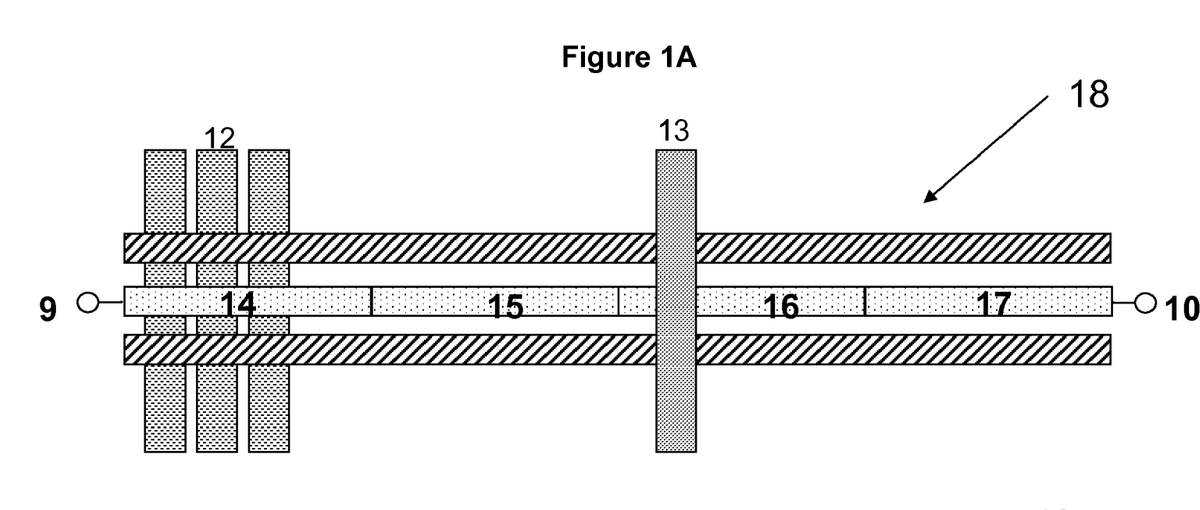
FIG. 1A illustrates an exemplary embodiment of the design of the single CPW of the present invention for linking to parasitic extraction tools in relation to t-lines showing cross-under and cross-over lines.
Figure 1B:
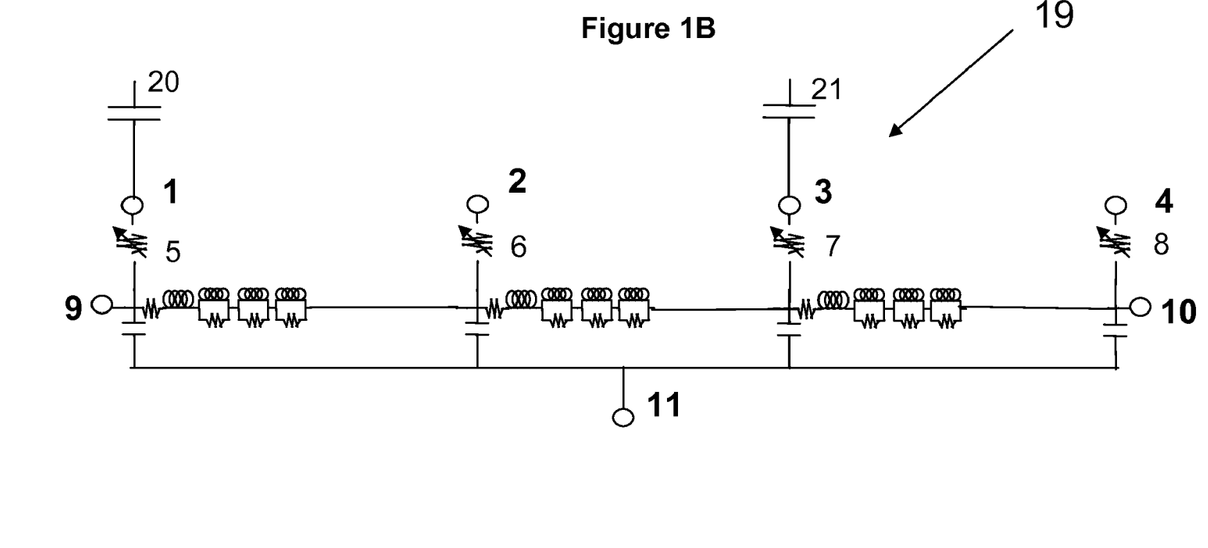
FIG. 1B illustrates an exemplary embodiment of the single CPW simulation netlist of the present invention for linking to parasitic extraction tools in relation to t-lines showing cross-under and cross-over lines.
Figure 1C:
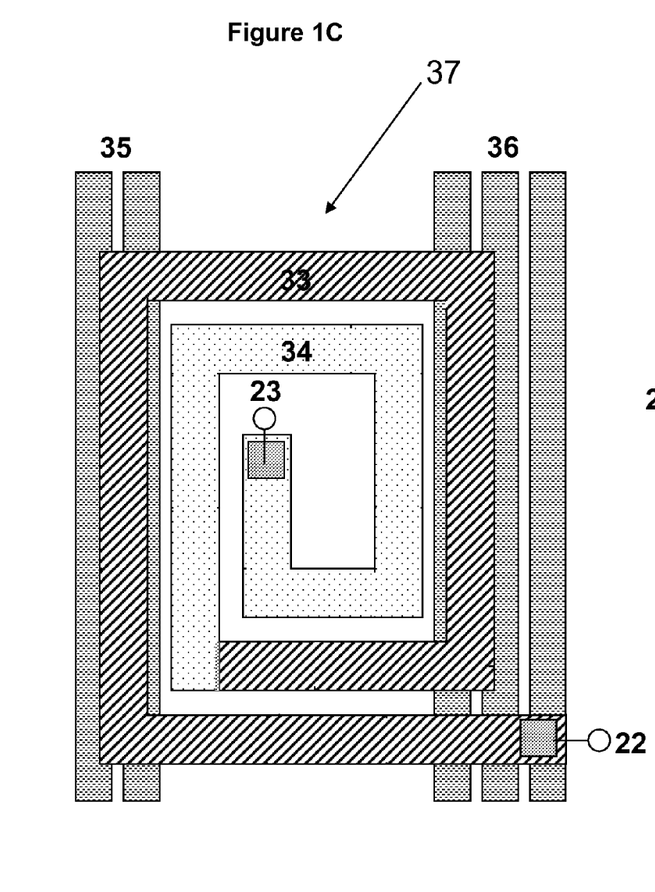
FIG. 1C illustrates an exemplary embodiment of the design of the on-chip spiral inductor of the present invention for linking to parasitic extraction tools in relation to the on-chip spiral inductor showing cross-under lines.
Figure 1D:
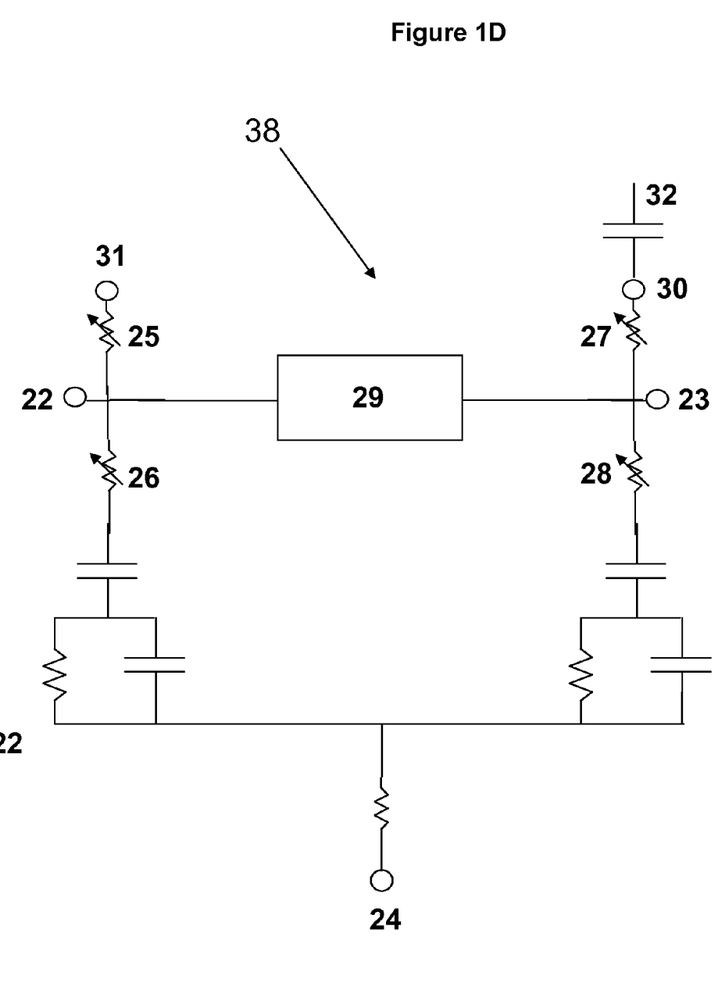
FIG. 1D illustrates an exemplary embodiment of the on-chip spiral inductor netlist of the present simulation invention for linking to parasitic extraction tools in relation to the on-chip spiral inductor showing cross-under lines.
Figure 2:
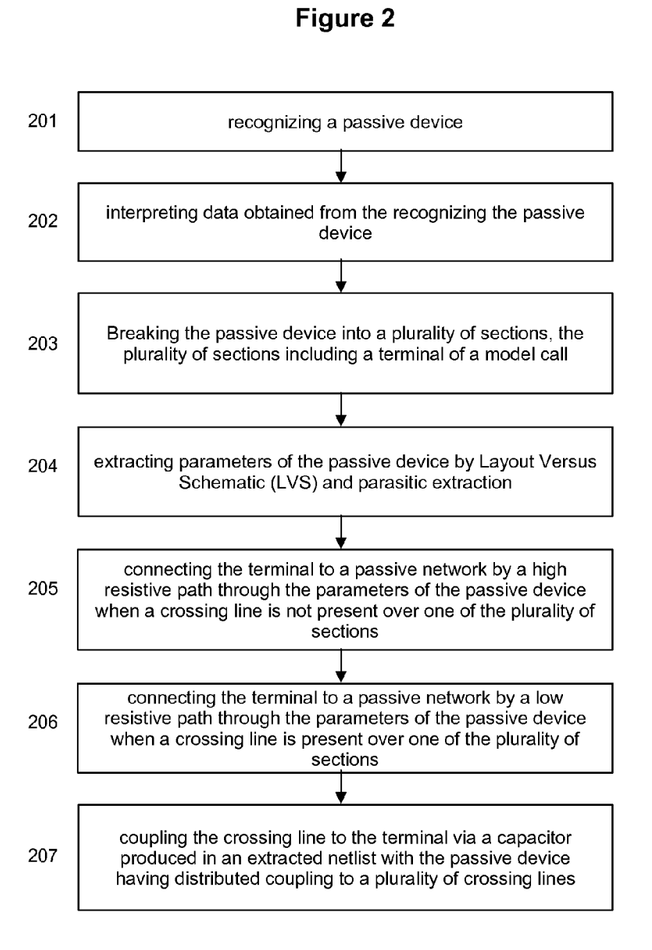
FIG. 2 is a flow chart illustration of an exemplary method of linking on-chip parasitic coupling capacitance into exemplary distributed pre-layout passive models of the present invention.
Figure 3:
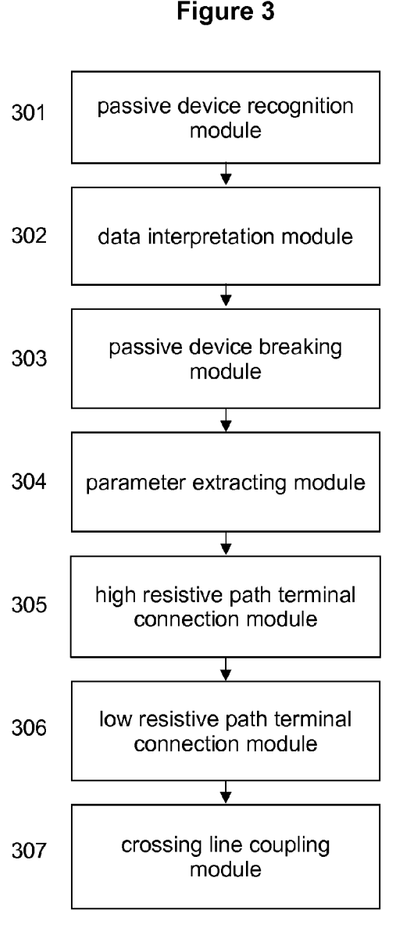
FIG. 3 is a flow chart illustration of an exemplary system of linking on-chip parasitic coupling capacitance into exemplary distributed pre-layout passive models of the present invention.

Referring now to the drawings, and more particularly to FIGS. 1-3, there are shown exemplary embodiments of the structures and method according to the present invention.

FIGS. 1A and 1B show exemplary embodiments of the layout design and the simulation netlist, respectively, of the single CPW netlist of the present invention for linking to parasitic extraction tools in relation to t-lines showing cross-under and cross-over lines.

FIG. 1A is an exemplary illustration of how a CPW is designed according to the present invention. Reference numeral 18 represents the layout design of the CPW. The design of the CPW 18 is exemplarily designed to include a CPW with three parallel lines, where the two outer lines are ground lines and the middle line is a signal line. The design of the CPW 18 assumes that the CPW includes on-chip back-end-of-the-line (BEOL) metal layers.

Exemplarily illustrated in FIG. 1A, CPW regions PEX_A, PEX_B, PEX_C, and PEX_D are respectively represented by reference numerals 14, 15, 16, and 17, in total making up a CPW signal line. Also, three cross-under metal lines in the PEX_A region are represented by reference numeral 12. One cross-over t-line in the PEX_C region is represented by reference numeral 13. In both FIG. 1A and FIG. 1B, voltage in and voltage out are respectively and exemplarily represented by 9 and 10.

FIG. 1B exemplarily illustrates the CPW simulation netlist 19 that is extracted from the layout design of the CPW 18. CPW terminals PEX_A, PEX_B, PEX_C, and PEX_D are respectively and exemplarily represented by reference numerals 1, 2, 3, and 4. Ra, Rb, Rc, Rd respectively represent resistances applied to CPW terminals PEX_A (1), PEX_B (2), PEX_C (3), and PEX_D (4) and are themselves respectively represented by reference numerals 5, 6, 7, and 8. A voltage shield node 11 is also included. Reference numerals 20 and 21 respectively represent parasitic capacitance from cross-under lines and a cross-over line extracted from the metal crossing lines 12 and 13 in the layout design 18.

After the layout design of a CPW 18 is completed, the design undergoes extraction of the layout of the design 18 by Layout Versus Schematic (LVS). During layout extraction, LVS recognizes needed CPW parameters and metal crossing lines 12 and 13, interprets the data from the recognition of the metal crossing lines 12 and 13, and extracts device parameters reflecting the presence of metal crossing lines 12 and 13 (i.e., in an exemplary case, cross_a=1, cross_b=0, cross_c=1, cross_d=0). Parasitic extraction from the layout design 18 provides parasitic capacitance 20 and 21 from metal crossing lines 12 and 13 extracted in the layout design 18 to be applied in the simulation netlist 19.

The CPW signal line is broken into several sections PEX_A (14), PEX_B (15), PEX_C (16), and PEX_D (17) with terminals 1, 2, 3, and 4 included in the model call for each section. If no metal crossing lines are present over a region in the CPW layout design 18, such as is exemplarily the case in regions 15 and 17, the corresponding terminals in the simulation netlist 19, exemplarily terminals 2 and 4, respectively, are connected to the transmission line network by a high-resistive path determined by input parameters (cross_b=0, cross_d=0). However, if metal crossing lines are present over a region in the CPW layout design 18, such as is exemplarily the case in regions 14 and 16, the corresponding terminals in the simulation netlist 19 are connected to the transmission line network by a low-resistive path determined by input parameters (cross_a=1, cross_c=1).

The high-resistive path is achieved by setting resistances 6 and 8 extremely high to effectively obtain an open circuit. An exemplary value of the resistances 6 and 8 is $1 \times 10^9 \Omega$. The low-resistive path is achieved by setting resistances 6 and 8 extremely low to effectively obtain a short circuit. An exemplary value of the resistances 5 and 7 is $1 \times 10^{-6} \Omega$.

The resultant exemplary simulation netlist 19 is achieved in FIG. 1B from the data extraction of the exemplary CPW layout design 18 in FIG. 1A. Parasitic extraction interprets the data from LVS and capacitively couples crossing lines to the appropriate terminals. Cross-under lines 12 under terminal 1 capacitively couple via parasitic capacitance 20 to terminal 1 and cross-over line 13 over terminal 3 is capacitively coupled via parasitic capacitance 21 to terminal 3. This provides an accurate parasitic network from the pre-layout transmission line by producing the extracted netlist with transmission line devices with distributed coupling to crossing lines. All parasitic capacitances 20 and 21 from metal crossing lines 12 and 13 in regions 14 and 16 respectively attach to terminals 1 and 3.

An example of the model calls from the LVS netlist extraction from the design 18 is shown below in Table 1: The conventional current extraction of the CPW layout design 18 considers all crossing metal layers as full planes no matter how sparse.

TABLE 1

LVS netlist extraction from CPW layout design 18.

| Current Extraction: | Proposed Extraction: |
|---|---|
| singlecpw(va vb vshield) | singlecpw(va vb PEX_A PEX_B PEX_C PEX_D vshield) |
| +layer_sig = 2 | +layer_sig = 2 |
| +layer_bot = 1 | +plane   = 0 |
| +layer_top = 3 | +cross_a = 1     If cross_a = 0: Ra = 1e9  Ohms |
| +plane     = 3 | +cross_b = 0     If cross_b = 1: Ra = 1e-6 Ohms |
|  | +cross_c = 1 |
|  | +cross_d = 0 |

This exemplary aspect of the present invention does not require any special input from a user and can be implemented with existing design kit components. Potential modifications to LVS, Model, and Cadence Library may be required.

Further, this exemplary aspect of the present invention may greatly improve accuracy of transmission line modeling by allowing delay in critical interconnect paths like clock lines to be accurately predicted with pre-layout models. S-parameter results may also be greatly improved, which is important for analog circuit applications. This exemplary aspect may also be implemented exemplarily into design kits.

FIGS. 1C and 1D show exemplary embodiments of the layout design and the simulation netlist, respectively, of the on-chip spiral inductor netlist of the present invention for linking to parasitic extraction tools in relation to on-chip spiral inductor showing cross-under lines.

FIG. 1C is an exemplary illustration of how an on-chip spiral inductor is designed according to the present invention. Reference numeral 37 represents the layout design of the on-chip spiral inductor. The design of the on-chip spiral inductor 37 is exemplarily designed to include an on-chip spiral inductor with more than two "turns" or loops. The design of the on-chip spiral inductor 37 assumes that the on-chip spiral inductor includes on-chip back-end-of-the-line (BEOL) metal layers.

Exemplarily illustrated in FIG. 1C, on-chip spiral inductor regions PEX_A and PEX_B are respectively represented by reference numerals 33 and 34 in total making up an on-chip spiral inductor. Also, three cross-under metal lines in the PEX_A region are represented by reference numeral 36. Another two cross-under metal lines in the PEX_A region are represented by reference numeral 35. In both FIG. 1C and FIG. 1D, voltage in and voltage out are respectively and exemplarily represented by 22 and 23.

FIG. 1D exemplarily illustrates the distributed on-chip spiral inductor simulation netlist 38 that is extracted from the layout design of the on-chip spiral inductor 37. On-chip spiral inductor terminals PEX_A and PEX_B are respectively and exemplarily represented by reference numerals 31 and 30. Ra0, Ra1, Rb0, and Rb1 respectively represent resistances applied to on-chip spiral inductor terminals PEX_A (1) and PEX_B (2) and are themselves respectively represented by reference numerals 25, 26, 27, and 28. A voltage shield/ground node 24 is also included. Reference numeral 32 represents the parasitic capacitance from cross-under lines extracted from the metal crossing lines 35 and 36 in the layout design 37.

After the layout design of an on-chip spiral inductor 37 is completed, the design undergoes extraction of the layout of the design 37 by Layout Versus Schematic (LVS). During layout extraction, LVS recognizes needed on-chip spiral inductor parameters and metal crossing lines 35 and 36, interprets the data from the recognition of the metal crossing lines 35 and 36, and extracts device parameters reflecting the presence of metal crossing lines 35 and 36 (i.e., in an exemplary case, cross_a=1 and cross_b=0). Parasitic extraction from the layout design 37 provides parasitic capacitance 32 from metal crossing lines 35 and 36 extracted in the layout design 37 to be applied in the simulation netlist 38.

The on-chip spiral inductor signal line is broken into two sections PEX_A (33) and PEX_B (34) with terminals 31 and 30 included in the model call for each section. If no metal crossing lines are present over a region in the on-chip spiral inductor layout design 37, such as is exemplarily the case in region 34, the corresponding terminal in the simulation netlist 38, exemplarily terminal 31 is connected to the on-chip spiral inductor network by a high-resistive path determined by the input parameter (cross_b=0). However, if metal crossing lines are present in a region in the on-chip spiral inductor layout design 37, such as is exemplarily the case in region 33 the corresponding terminal in the simulation netlist 38 is connected to the distributed on-chip spiral inductor network by a low-resistive path determined by input parameter (cross_a=1).

A high-resistive path is achieved by setting resistance 25 extremely high to effectively obtain an open the circuit path to terminal 31. Also, at the same time, resistance 26, is set to an extremely low value to effectively obtain a short circuit path to the existing capacitors and resistors in the model. Likewise, a low-resistive path is achieved by setting resistance 27 extremely low to effectively obtain a short circuit path to terminal 30. Also, at the same time, resistance 28, is set to an extremely high value to effectively obtain an open circuit path to the existing capacitors and resistors in the model. An exemplary value of the resistances 25 and 28 is $1\times10^9 \Omega$. The low-resistive paths are achieved by setting resistances 26 and 27 extremely low to effectively obtain effective short circuits in the model netlist. An exemplary value of the resistances 26 and 27 is $1\times10^{-6} \Omega$.

The resultant exemplary simulation netlist 38 is achieved in FIG. 1D from the data extraction of the exemplary on-chip spiral inductor layout design 37 in FIG. 1C. Parasitic extraction interprets the data from LVS and capacitively couples crossing lines to the appropriate terminals. Cross-under lines 35 and 36 under region 33 capacitively couple via parasitic capacitance 32 to terminal 30. This provides an accurate parasitic network from the distributed pre-layout on-chip spiral inductor by producing the extracted netlist with on-chip spiral inductors with distributed coupling to crossing lines. The parasitic capacitances 32 from metal crossing lines 35 and 36 in region 33 attach to terminals 30.

An example of the model calls from the LVS netlist extraction from the design 37 is shown below in Table 2: The conventional current extraction of the on-chip spiral inductor layout design 37 does not consider the crossing metal layers.

TABLE 2

LVS netlist extraction from on-chip spiral inductor layout design 37.

| Current Extraction: | Proposed Extraction: |
|---|---|
| inductor(va vb gnd) | inductor(va vb PEX_A PEX_B gnd)<br>+cross_a = 1 ← cross_a = 1:<br>+cross_b = 0     Ra0 = 1e-6 Ohms<br>                      Ra1 = 1e9 Ohms<br>No current way to    cross_b = 0:<br>estimate cross-under       Rb0 = 1e9 Ohms<br>capacitance              Rb1 = 1e-6 Ohms |

This exemplary aspect of the present invention does not require any special input from a user and can be implemented with existing design kit components, Potential modifications to LVS, Model, and Cadence Library may be required.

Further, this exemplary aspect of the present invention may greatly improve accuracy of pre-layout distributed passive modeling such as transmission line modeling and on-chip spiral inductor modeling by allowing delay in critical interconnect paths like CPW clock lines and spiral inductor circuit paths to be accurately predicted with pre-layout models. S-parameter results may also be greatly improved, which is important for analog circuit applications. This exemplary aspect may also be implemented exemplarily into design kits.

FIG. 2 illustrates an exemplary method 200 of linking on-chip parasitic coupling capacitance into distributed pre-layout passive models such as on-chip spiral inductor models or transmission line models of the present invention. The method includes recognizing (201) a passive device (such as an on-chip spiral inductor device or transmission line device), interpreting (202) data obtained from the recognizing the passive device, breaking (203) the passive device into a plurality of sections, the plurality of sections including a terminal of a model call, extracting (204) parameters of the passive device by Layout Versus Schematic (LVS) and parasitic extraction, connecting (205) the terminal to a passive network (such as an on-chip spiral inductor network or transmission line network) by a high resistive path through the parameters of the passive device when a crossing line is not present over one of the plurality of sections, connecting (206) the terminal to a passive network by a low resistive path through the parameters of the passive device when a crossing line is present over one of the plurality of sections, and coupling (207) the crossing line to the terminal via a capacitor produced in an extracted netlist with the passive device having distributed coupling to a plurality of crossing lines.

FIG. 3 illustrates an exemplary system 300 of linking on-chip parasitic coupling capacitance into distributed pre-layout passive models such as transmission line models and on-chip spiral inductor models of the present invention. The system includes a passive device (such as an on-chip spiral inductor device or transmission line device) recognition module (301) for recognizing a passive device, a data interpretation module (302) for interpreting data obtained from the passive device recognition module, a passive device breaking module (303) for breaking the passive device into a plurality of sections, the plurality of sections including a terminal of a model call, a parameter extracting module (304) for extracting parameters of the passive device by Layout Versus Schematic (LVS) and parasitic extraction, a high resistive path terminal connection module (305) for connecting the terminal to a passive network by a high resistive path through the parameters of the passive device when a crossing line is not present over one of the plurality of sections, a low resistive path terminal connection module (306) for connecting the terminal to a passive network (such as an on-chip spiral inductor network or transmission line network) by a low resistive path through the parameters of the passive device when a crossing line is present over one of the plurality of sections, and a crossing line coupling module (307) for coupling the crossing line to the terminal via a capacitor produced in an extracted netlist with the passive device having distributed coupling to a plurality of crossing lines.

The various method embodiments of the invention will be generally implemented by a computer executing a sequence of program instructions for carrying out the steps of the method, assuming all required data for processing is accessible to the computer. The sequence of program instructions may be embodied in a computer program product comprising media storing the program instructions. As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the method, and variations on the method as described herein. Alternatively, a specific use computer, containing specialized hardware for carrying out one or more of the functional tasks of the invention, could be utilized.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM) or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then complied, interpreted, of otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave, The computer usable program code may be transmitted using any appropriate medium, including but not limited to wireless, wired, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, though the Internet using an Internet Service Provider).

The present invention is described above with reference to flow chart illustrations and/or block diagrams of methods, apparatus (systems) and computer program products according to embodiments of the invention. It will be understood that each block of the flow chart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instructions means which implement the function/act specified in the flowchart and/or block diagram block of blocks.

The computer program instruction may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although a few examples of the present invention have been shown and described, it would be appreciated by those skilled in the art that changes might be made in these embodiments without departing from the principles and spirit of the invention, the scope of which is defined in the claims and their equivalents.

What is claimed is:

1. A computer implemented method of linking on-chip parasitic coupling capacitance into distributed pre-layout passive models, the method comprising:
    recognizing, by a computing device, a passive device;
    interpreting, by said computing device, data obtained from the recognizing of the passive device;
    breaking the passive device, by said computing device, into a plurality of sections, the plurality of sections comprising a terminal of a model call;
    extracting, by said computing device, parameters of the passive device by Layout Versus Schematic (LVS) and parasitic extraction;
    connecting the terminal, by said computing device, to a distributed pre-layout passive model network by selecting low and high resistive netlist paths through the parameters of the passive device depending on if crossing lines are present or not present in one of the plurality of sections; and
    coupling the crossing lines, by said computing device, to the terminal via capacitors produced in an extracted netlist, with the passive device having distributed coupling to a plurality of crossing lines,
    wherein the distributed pre-layout passive models comprise a plurality of terminals to which post-layout extracted parasitics are attached to correctly model effects of a varying density of the plurality of crossing lines within the layout of the passive device.

2. The computer-implemented method according to claim 1 wherein the passive models include transmission line models.

3. The computer-implemented method according to claim 1 wherein the passive models include on-chip spiral inductor models.

4. The computer-implemented method according to claim 1 wherein the passive device includes a transmission line device.

5. The computer-implemented method according to claim 1 wherein the passive device includes an on-chip spiral inductor device.

6. A system for linking on-chip parasitic coupling capacitance into distributed pre-layout passive models, the system comprising:
    a passive device recognition module that recognizes a passive device;
    a data interpretation module that interprets data obtained from the passive device recognition module;
    a passive device breaking module that breaks the passive device into a plurality of sections;
    a parameter extracting module that extracts parameters of the passive device;
    a high resistive path terminal connection module that connects a terminal of a high resistive path of the passive device to a passive network;
    a low resistive path terminal connection module that connects a terminal of a low resistive path of the passive device to a passive network; and
    a crossing line coupling module that couples a crossing line to the terminal via a capacitor produced in an extracted netlist with the passive device having distributed coupling to a plurality of crossing lines.

7. The system according to claim 6 wherein the distributed pre-layout passive models include transmission line models.

8. The system according to claim 6 wherein the distributed pre-layout passive models include on-chip spiral inductor models.

9. The system according to claim 6 wherein the passive device includes a transmission line device.

10. The system according to claim 6 wherein the passive device includes an on-chip spiral inductor device.

11. The system according to claim 6 wherein the plurality of sections includes a terminal of a model call.

12. The system according to claim 6 wherein the parameter extracting module includes Layout Versus Schematic (LVS) and parasitic extraction for extracting parameters of the passive device.

13. The system according to claim 6 wherein the high resistive path terminal connection module includes connecting a high resistive path through the parameters of the passive device when a crossing line is not present over one of the plurality of sections for connecting the terminal to a passive network.

14. The system according to claim 6 wherein the low resistive path terminal connection module includes connecting a low resistive path through the parameters of the passive device when a crossing line is present over one of the plurality of sections for connecting the terminal to a passive network.

15. A non-transitory computer readable medium tangibly embodying a computer program, wherein the computer program when executed on a computer causes the computer to implement a method for linking on-chip parasitic coupling capacitance into distributed pre-layout passive models, the method comprising:

recognizing a passive device;

interpreting data obtained from the recognizing of the passive device;

breaking the passive device into a plurality of sections, the plurality of sections comprising a terminal of a model call;

extracting parameters of the passive device by Layout Versus Schematic (LVS) and parasitic extraction;

connecting the terminal to a distributed pre-layout passive model network by selecting low and high resistive netlist paths through the parameters of the passive device depending on if crossing lines are present or not present in one of the plurality of sections; and coupling the crossing lines to the terminal via capacitors produced in an extracted netlist, with the passive device having distributed coupling to a plurality of crossing lines, wherein the distributed pre-layout passive models comprise a plurality of terminals to which post-layout extracted parasitics are attached to correctly model effects of a varying density of the plurality of crossing lines within the layout of the passive device.

16. The non-transitory computer readable medium according to claim 15 wherein the passive models include transmission line models.

17. The non-transitory computer readable medium according to claim 15 wherein the passive models include on-chip spiral inductor models.

18. The non-transitory computer readable medium according to claim 15 wherein the passive device includes a transmission line device.

19. The non-transitory computer readable medium according to claim 15 wherein the passive device includes an on-chip spiral inductor device.

* * * * *